(12) United States Patent
Kwok et al.

(10) Patent No.: US 6,630,289 B1
(45) Date of Patent: Oct. 7, 2003

(54) PHOTO-PATTERNED LIGHT POLARIZING FILMS

(75) Inventors: Hoi-Sing Kwok, Kowloon (HK); Wing-Chiu Yip, Chai Wan (HK); Vladimir Chigrinov, Kowloon (HK); Vladimir Kozenkov, Kowloon (HK)

(73) Assignee: The Hong Kong University of Science and Technology, Hong Kong (HK)

( * ) Notice: Subject to any disclaimer, the term of this patent is extended or adjusted under 35 U.S.C. 154(b) by 16 days.

(21) Appl. No.: 09/642,819

(22) Filed: Aug. 22, 2000

(51) Int. Cl.$^7$ .............. G02F 1/03; G03F 7/00; B05D 5/06
(52) U.S. Cl. .......... 430/321; 430/20; 430/200; 430/256; 430/320; 430/322; 427/162
(58) Field of Search .......... 430/20, 256, 320, 430/321, 322, 200; 427/162

(56) References Cited

U.S. PATENT DOCUMENTS

| | | | | |
|---|---|---|---|---|
| 2,524,286 A | | 10/1950 | Dreyer | 359/491 |
| 3,658,616 A | * | 4/1972 | Dreyer | 156/234 |
| 5,602,661 A | * | 2/1997 | Schadt et al. | 349/124 |
| 5,693,446 A | * | 12/1997 | Staral et al. | 430/201 |
| 5,739,296 A | | 4/1998 | Gvon et al. | 534/577 |
| 6,017,863 A | * | 1/2000 | Cala et al. | 510/200 |
| 6,084,647 A | * | 7/2000 | Hatano | 349/15 |
| 6,224,976 B1 | * | 5/2001 | Takushima et al. | 428/355 |
| 6,306,563 B1 | * | 10/2001 | Xu et al. | 430/321 |

FOREIGN PATENT DOCUMENTS

| | | |
|---|---|---|
| FR | 2 186 165 | 1/1974 |
| SU | 697 950 | 11/1979 |

* cited by examiner

*Primary Examiner*—Mark F. Huff
*Assistant Examiner*—Nicole Barreca
(74) *Attorney, Agent, or Firm*—Burns, Doane, Swecker & Mathis, L.L.P.

(57) ABSTRACT

This invention relates to methods for preparing photo-patterned mono- or polychromatic, polarizing films. The polarizer can be pixelated into a number of small regions wherein some of the regions have one orientation of the principal neutral or color absorbing axis; and some other of the said regions have another orientation of the principal neutral or color absorbing axis. The axis orientation is determined by the polarization vector of actinic radiation and the multi-axes orientation is possible by a separated masked exposure. This polarizer can be placed on the interior substrate surface of the LCD cell.

21 Claims, 10 Drawing Sheets

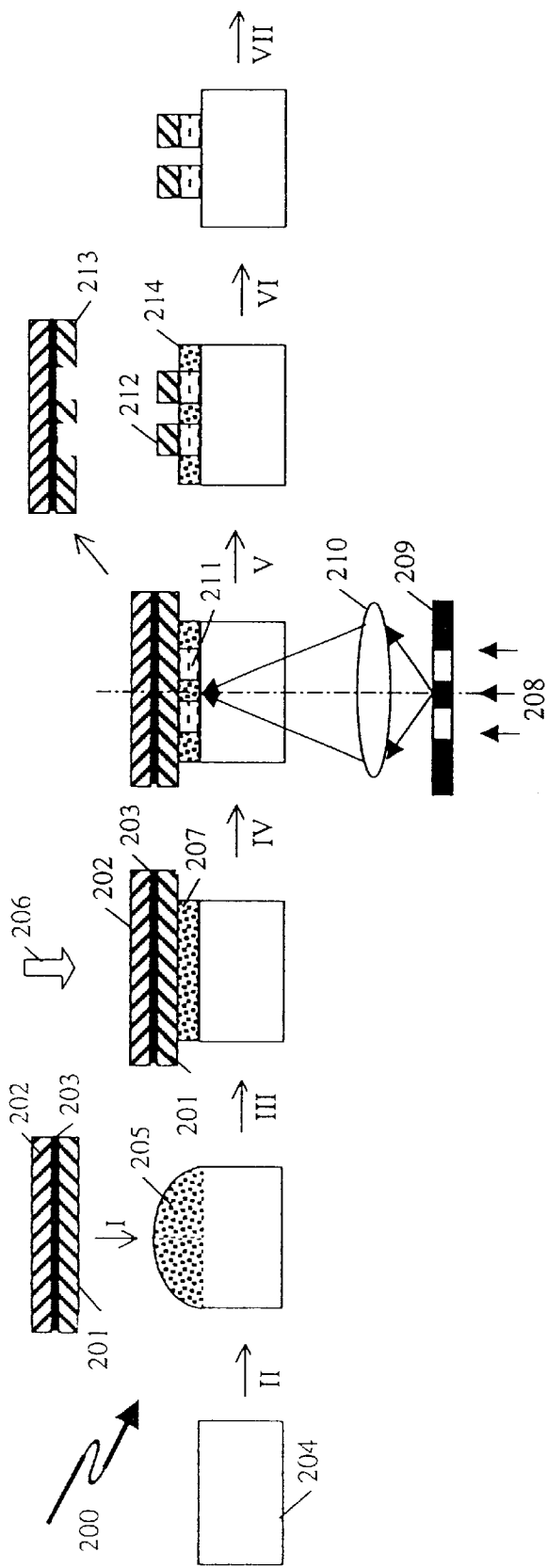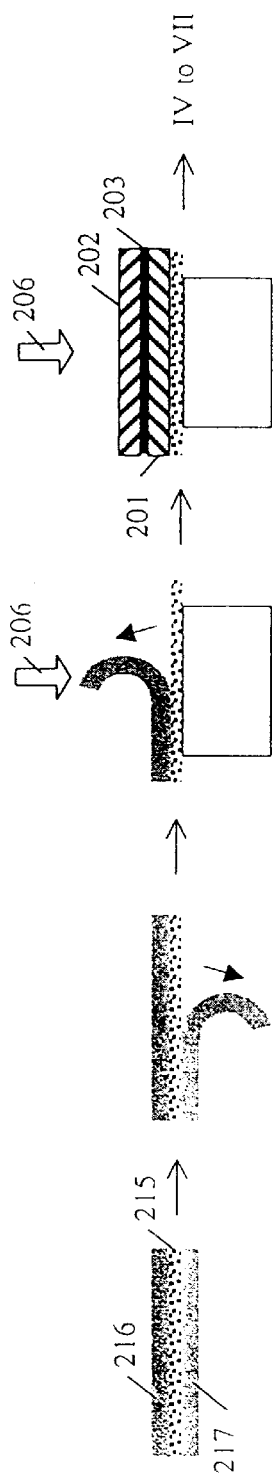
Fig 2b
Fig 2c

X, Y=-NR, -N(R)$_2$, -R; where R=Alkyl(C$_1$-C$_{18}$)

(1)

(2)

(3)

PHOTO-PATTERNED LIGHT POLARIZING FILMS

FIELD OF THE INVENTION

This invention relates to the preparation of ordered organic molecular layers both on flexible and rigid substrates. In particular the invention relates to methods for the preparation of thin light polarization films of lyotropic liquid crystal, which can be used, for example, as the internal polarizers, as well as dichroic polarizers, for the production of liquid crystal displays (LCDs).

BACKGROUND OF THE INVENTION

Light-polarization films or polarizers are major components of liquid crystal displays (LCDs) and other liquid crystal (LC) devices. Common polarizers are based on polyvinyl-alcohol-iodine (PVA) films of 30–50 μm thickness. These polarizers are generally placed on the external glass surfaces of the LC cell and require protective films (e.g. cellulose triacetate or cellulose acetate butyrate). Their fabrication is rather complicated and expensive. The external placement of the polarizers results in additional reflections and parallax effect, which deteriorates the LCD contrast, optical performance and viewing angles. Consequently, thin internal polarizers for LCDs are highly desirable. However, this variant still cannot be realized on the basis of conventional PVA films.

PRIOR ART

FR 2,186,165 discloses a method of forming internal polarizers by coating a long linear polymer film (e.g. PVA) to the internal surfaces of the glass substrates. The polymeric solution is then subjected to a linearly mechanical deformation (e.g. using a rubber rod), giving rise to a preferential direction parallel to the substrate plane. This results in an ordering of the long polymeric molecules along the direction of the deformation. Subsequently, the ordered molecular state can be fixed after the evaporation of the solvent. The final polarization film is obtained by a volume impregnation of iodine vapor or iodine solution or a deposition of a dichroic dye. This method is complicated, unreliable and inefficient for LCD manufacturing processes. One of the disadvantages of the method is the diffusion of the iodine molecules into the bulk of the LC. Thus, it leads to the deteriorated resistivity, increased power consumption and diminished life time of the LCD.

Lyotropic liquid crystals (LLCs) can also be used for the purpose of the preparation of thin polarization films. The LLCs in an organic solvent can be coated on the glass substrate by a mechanical shear flow. After the evaporation of the solvent, the molecular order is maintained in LLC solid film.

Another method is described in U.S. Pat. No. 2,524,286 and 5,739,296 (FIG. 1). The isotropic solution of the lyotropic dye 5 is deposited from the tank 3 onto the anisotropic surface I of the flexible polymer film 2. So a thin film 4 of the dye solution can be formed. Low-cost polyethylene-terephthalate (PET) film can be used as the polymer film 2. The other variants include the deposition onto the thin layer (0.1–0.5 μm) of paraffin wax, mineral oil, barium stearate, a resin or other materials. Afterwards, the dye layer is oriented by rubbing or brushing to form the anisotropic film 4. The organic solvent can be composed of water dissolved with low molecular weight solvents, such as acetone, alcohol, dioxane etc. First the ordered nematic LLC phase is formed in the film 7 after the partial evaporation of the solvent 8. The final evaporation of the solvent 9, when baking the film 7, results in a highly ordered solid film of the lyotropic dye 11 with good extinction ratio. The typical thickness of LLC polarizers is 0.3–0.5 μm, which is comparable with the thickness of usual LC alignment layers. The thickness can be regulated by the gap 14 between the die 15 and the surface 1 of the substrate 2.

The rate of the evaporation is an important factor. Rapid evaporation at a high temperature results in a "boiling" of the solution, while a slow evaporation rate at a low temperature leads to the formation of randomly oriented dye polycrystals, thus affecting the optical quality of the light polarization films.

An adhesive layer is used for the transfer of the polarization film from the flexible polymer carrier to the glass substrate of an LCD cell. The adhesive may be pressure sensitive or other permanently tacky type which is rendered tacky by the application of water or other solvent, by heat or other means. For the tacky type adhesives, chlorinated latex, poly-isobutylene of low molecular weight etc. may be used.

Light polarization films of a large size can be formed, as can leaves of a medium size and special forms, which can be cut from the plane leaves. A volume form is also possible, if convex or concave substrates are applied e.g. for lenses, lamp bulbs etc.

This technology makes it possible to fabricate multi-layer light-polarization structures with specific orientations of the optical axes in each layer as well as polychromatic absorption properties. The polarization film possesses a high radiation stability, high temperature stability (up to 200° C.), high color fastness and UV-stability. These properties make such films attractive for the replacement of iodine based external polarizers in current LCD production.

During the manufacturing process, however, the appearance of defects in the form of horizontal stripes several to ten microns wide is possible. The defects divide the areas with different molecular orientations which are clearly seen in a polarized light as the vertical bands. The sources of such defects are the turbulence of LLC flow, non-uniform properties of the alignment layer and non-optimal deposition conditions. Minimizing the defects is possible by changing the deposition speed and LLCs viscosity, using the corona discharge to prepare the substrate, reducing the shift rate of the substrate and fixing the deposition device position.

USSR Pat. No 697,950 proposes the formation of the internal polarizers using LLCs. The procedure describes the deposition of the lyotropic gel of 1–30 wt/wt % on the surface of the transparent electrodes. The gel is then subjected to a shear flow in the velocity of $10^2$–$10^7$ $sec^{-1}$, e.g. by spin coating. The procedure is followed by baking-out the solvent.

The proposed technology allows the use of thin light polarization film based on LLCs for the internal LCD polarizers. However the polarization direction cannot be made arbitrarily to follow a specific local distribution, e.g. to follow a mosaic picture with the characteristic size of tens of microns or less. This limitation is due to the poor spatial resolution of the proposed method.

The purpose of the proposed invention is to develop a new technology for the fabrication of thin neutral or color polarizers, with a desired distribution of the polarization axis, for LCD applications.

SUMMARY OF THE INVENTION

The objective of the present invention is to provide a new technology for the fabrication of thin photo-patterned (pixelated) polarizers with a desired local distribution of the polarization axis.

According to the present invention there is provided a method of forming a thin light polarization film on a substrate, comprising the steps of: (a) depositing a thin solid film polarizer onto a flexible polymeric carrier sheet, (b) applying a photo-curable glue onto said substrate, (c) bringing said thin solid film polarizer into contact with said glue, (d) illuminating and curing said glue, and (a) removing said carrier sheet.

In a preferred embodiment the step of illuminating and curing said glue is carried out by illuminating said glue in a pattern whereby a pattern of cured glue is formed and whereby when said carrier sheet is removed said thin solid film polarizer only remains attached to said glue in said pattern. Regions of glue that are not cured may be removed by a solvent., Preferably the illumination is carried out through a patterned mask. This mask may be a shadow mask or a photomask formed by photolithography.

In a preferred embodiment of the invention the light polarization film is formed on the substrate in a pattern formed by regions of at least two different directions of polarization. This may be achieved by: (a) depositing a first solid thin film polarizer on a first flexible carrier, said first polarizer having a first polarization direction, (b) applying a photo-curable glue to said substrate, (c) bringing said first solid thin film polarizer into contact with said glue, (d) illuminating said glue in a first pattern to form a pattern of cured glue having said first solid thin film polarizer adhered thereto, (e) removing said first flexible carrier leaving said first solid thin film polarizer adhered to said substrate by said glue in said first pattern, (f) depositing a second solid thin film polarizer on a second flexible carrier, said second polarizer having a second polarization direction, (g) applying a photo-curable glue to said substrate, (h) bringing said second solid thin film polarizer into contact with said glue, (i) illuminating said glue in a second pattern to form a pattern of cured glue having said second solid thin film polarizer adhered thereto, and (j) removing said second flexible carrier leaving said second solid thin film polarizer adhered to said substrate by said glue in said second pattern.

In preferred forms of the invention the light polarization film is divided into pixels having different light polarization directions, and these pixels may be divided into sub-pixels, each sub-pixel being formed with different absorption colors. Alternatively, all the pixels may have the same polarization direction.

The flexible carrier sheet may be formed of an isotropic or non-isotropic polymeric material, and may include a detachment layer. Preferably the detachment layer also serves as a polarization alignment layer. The detachment layer may comprise a film of material selected from the group consisting of paraffin wax, mineral oils, barium stearate, resins, uniaxially aligned polyethyleneterephthalate or the like. This detachment and alignment layer can be rubbed mechanically to obtain a desired orientation.

The thin light polarization film is preferably formed on a substrate forming the inner surface of a liquid crystal display.

According to the present invention there is further provided a method of forming a thin light polarization film comprising the steps of: (a) depositing a layer of photoalignable material on a substrate, (b) illuminating the photoalignable layer with actinic radiation to define a polarization axis of said photoalignable layer, (c) applying a thin layer of an isotropic absorber solution onto said photoalignable layer, (d) partially evaporating said solution to form a gel, and (e) baking said gel to form an anisotropic absorber layer.

In one embodiment of the invention the actinic radiation is linearly polarized and the principal absorption axis of said photoalignable layer is orthogonal to the polarization vector of said actinic radiation. In another embodiment of the invention the actinic radiation is non-polarized and is incident on said photoalignable layer at an oblique angle.

Preferably the photoalignable layer is illuminated through a mask whereby only selected regions of said layer are aligned. More preferably still, the photoalignable layer is illuminated through several masks in sequence whereby different regions of said photoalignable layer may be formed with different alignment axes. The photoalignable layer may be illuminated through a photo-patterned mask that transforms linearly polarized or non-polarized actinic radiation into actinic radiation having a spatial distribution of polarization vectors, and this photo-patterned mask may be a light polarization mask or a birefringence mask.

Preferably more than one absorber material may be provided and different absorbers may be chosen with different colors. The absorber may comprise lyotropic liquid crystal. The photoalignable material may preferably be an organic azodye.

The photoalignable material may be deposited in a layer of from 0.05 to 1.5 $\mu$m thick, while the absorber material may have a thickness of from 0.3 to 1.5 $\mu$m.

Preferably the thin light polarization film is formed on a substrate forming an inner surface of a liquid crystal cell.

Viewed from a still further aspect the present invention provides a thin light polarization film deposited on a substrate and comprising a plurality of pixels, wherein said pixels are formed with different axes of polarization. This light polarization)film may be formed on the internal surface of a substrate defining a liquid crystal cell.

BRIEF DESCRIPTION OF THE DRAWINGS

Some embodiments of the invention will now be described by way of example and with reference to the accompanying drawings, in which:

FIGS. 2a–c show (a) a high level flow chart showing the process of the fabrication of a photo-patterned (pixelated) polarizer in accordance with a first embodiment of the present invention (photo-hardened adhesives), and (b) & (c) schematically ilustrate the process.

DETAILED DESCRIPTION OF THE PREFERRED EMBODIMENTS

The present invention proposes the use of two technological solutions to obtain photo-patterned (pixelated) thin light polarization films, with different polarization axis and/or different local color regions, for LCD production. Both solutions are based on the application of lyotropic liquid crystals (LLCs). In the first variant, the neutral and/or color polarizers are obtained using photo-hardened adhesive, while the second variant uses a photo-alignment layer to obtain neutral and/or color LLC polarizers.

Figure 1:
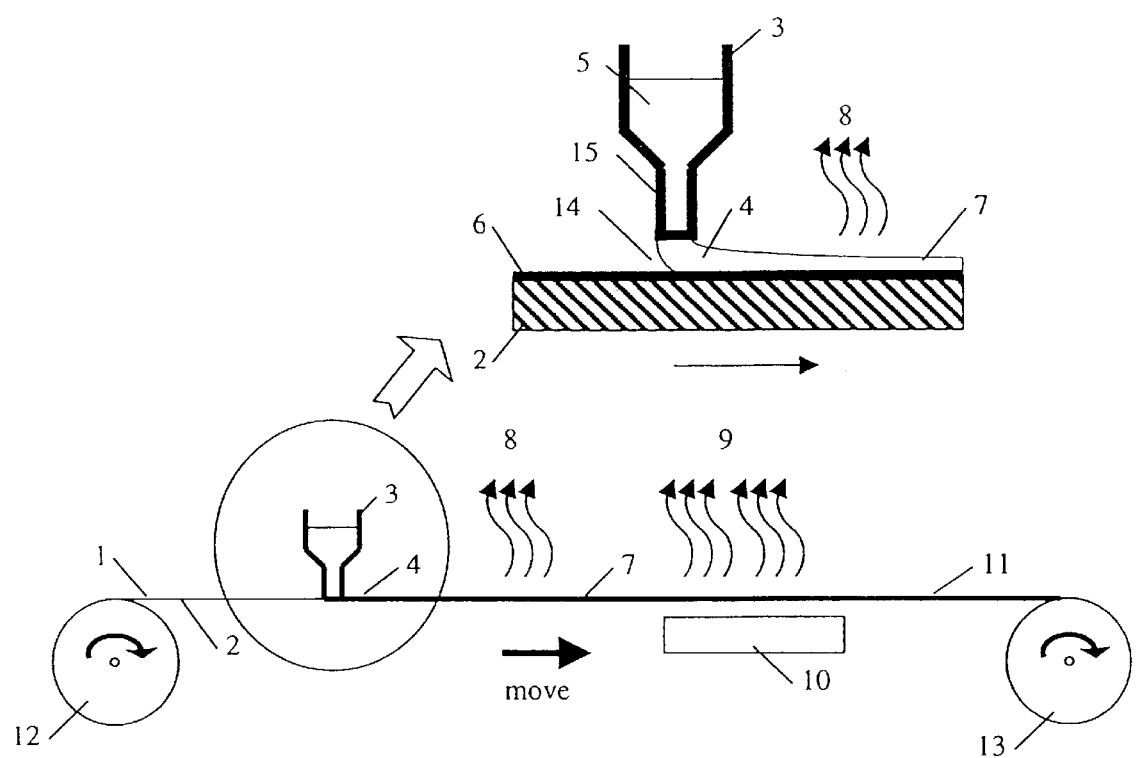
FIG. 1 illustrates a lyotropic liquid crystal coated on a polymeric film for the preparation of a thin film polarizer.
Figure 2A:
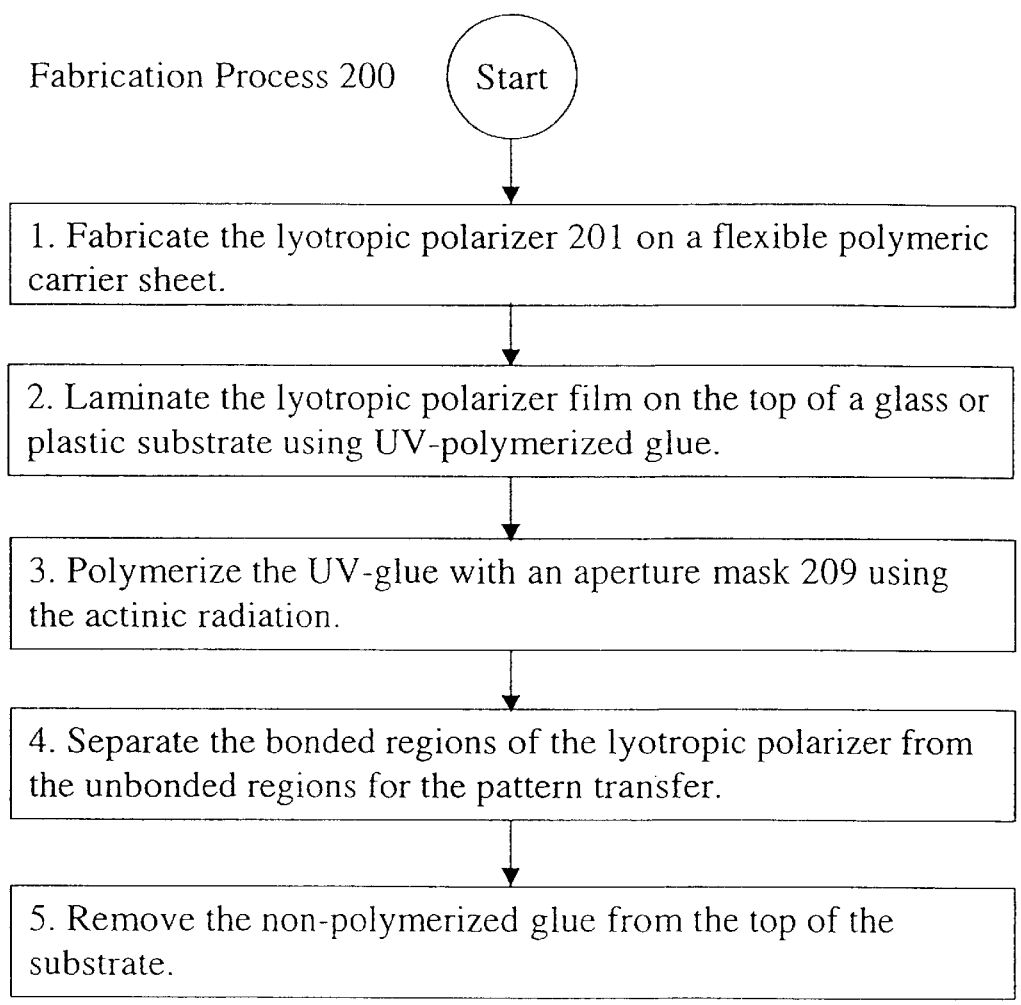

In FIGS. 2a–c, a flow chart 200 of one example process for the fabrication of patterned (pixelated) polarizers in accordance with this invention is shown. At the first step, the method shown in FIG. 1 is used to prepare a thin polarization film 201 (FIG. 2b). The polarizer 201 comprises a thin solid substance, which exhibits a nematic state in an organic solvent. The solid film is coated on the flexible polymeric carrier sheet 202. The surface of the sheet 202 may be treated for anisotropic LLC orientation. The treatment includes, in particular, the deposition of a thin layer of a paraffin wax, mineral oil, barium stearate, a resin or other materials. The surface of this layer is then rubbed or brushed. To diminish the adhesion of the anisotropic solid film 201 to the carrier 202, which is needed for the separation of the polarizer 201 from the carrier 202, a detachment layer 203 of 1 μm thick can be included. This layer can be formed e.g. from paraffin wax or other easy-melting substances. The flexible carrier sheet may be composed of low-cost polymer sheets of polyethyleneterephthalate (PET) film with a weak adhesion to the thin film polarizer 201 in which case an additional detachment layer may not be necessary.

To transfer the thin film polarizer 201 onto the substrate 204, the top surface of the substrate 204 is coated with a photo-polymerized glue 205. Then, the flexible polymeric carrier sheet 202 with the thin film polarizer 201 is put in contact with the substrate 204. The orientation of the carrier sheet 202 is maintained for a particular polarization axis with respect to the substrate 204. The stacked construction is pressed 206 to obtain a uniform thin layer 207 of the photo-polymerized glue. Vacuum pressing may help reduce the air bubbles trapped inside the thin layer 207. UV glue (e.g. Worland 65) should not dissolve the thin polarizer layer 201.

Afterwards, an aperture mask 209 is illuminated by UV light 208 and an image of the mask is projected by a lens 210 onto the thin layer 207. The illuminated regions 211 will be hardened and the hardened parts 211 of the UV-glue bond strongly to the thin film polarizer 201 on one side and the substrate on the other. The non-hardened parts of the UV glue 214 can be removed from the substrate by an organic solvent. In this way, a photo-patterned polarizer structure 212 can be obtained after the polarization film is separated mechanically from the substrate, leaving a complementary negative structure 213 on the carrier sheet 202.

To obtain a photo-patterned (pixelated) polarizer with different local orientations of the polarization axis, the operations I–VI (FIG. 2b) are repeated with a set of thin film polarizers 201 oriented at different directions and with corresponding aperture masks. The feature size of thin film polarizers (pixels) obtained in this manner can be less than 10 μm.

A dry photo-polymerized glue (e.g. produced by Du Pont de Nemours) can be used for the purpose of pattern transfer. The structure of the dry photo-polymerized glue is shown in FIG. 2c. The structure includes a flexible and dry photo-polymerized glue film 215 and two protection layers 216 and 217. At the first step, the protection layer 217 is taken away and the dry glue film 215 is laminated onto the surface of the substrate 204 before the other protection layer 216 is removed. Afterwards, the above mentioned operations (IV–VII) are repeated as shown in FIG. 2b.

Figure 3:
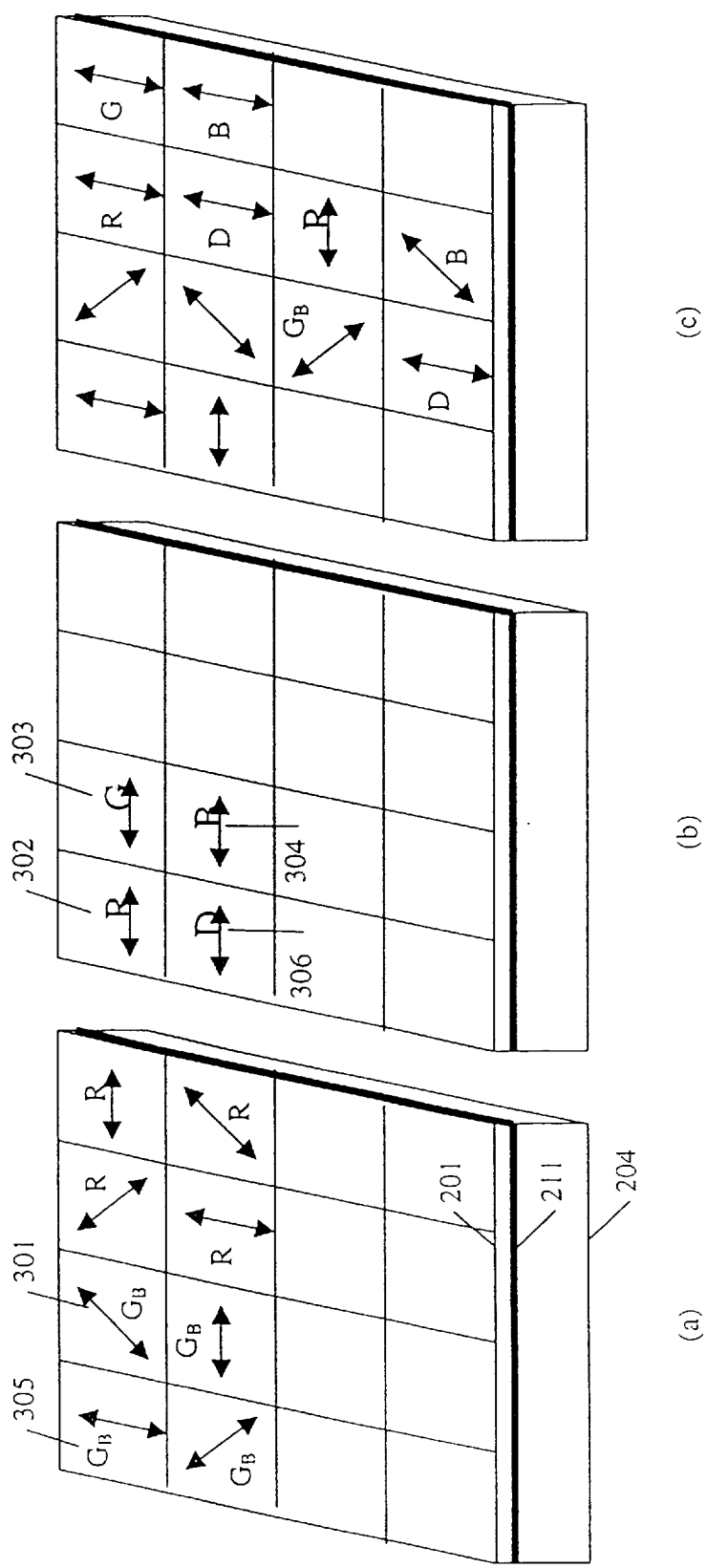
FIGS. 3a–c illustrate possible methods for the formation of photo-patterned (pixelated) mono- or polychromatic and/or dichroic thin film polarizers.

In FIGS. 3a–c, possible variants of the formation of photo-patterned mono- or polychromatic thin film polarizers with different local axis orientation are illustrated. The letters R(302), G(303), B(304), GB(305) and D(306) denote Red, Green, Blue, Gray (Black) and Dichroic polarizers respectively, whereas the arrow 301 shows the direction of the optical axis orientation in the corresponding pixels. The technology of the present invention allows thin (0.3–1 μm thick) photo-patterned (pixelated) polarizers to be obtained, which are either neutral or color, for LCDs applications.

Figure 4A:
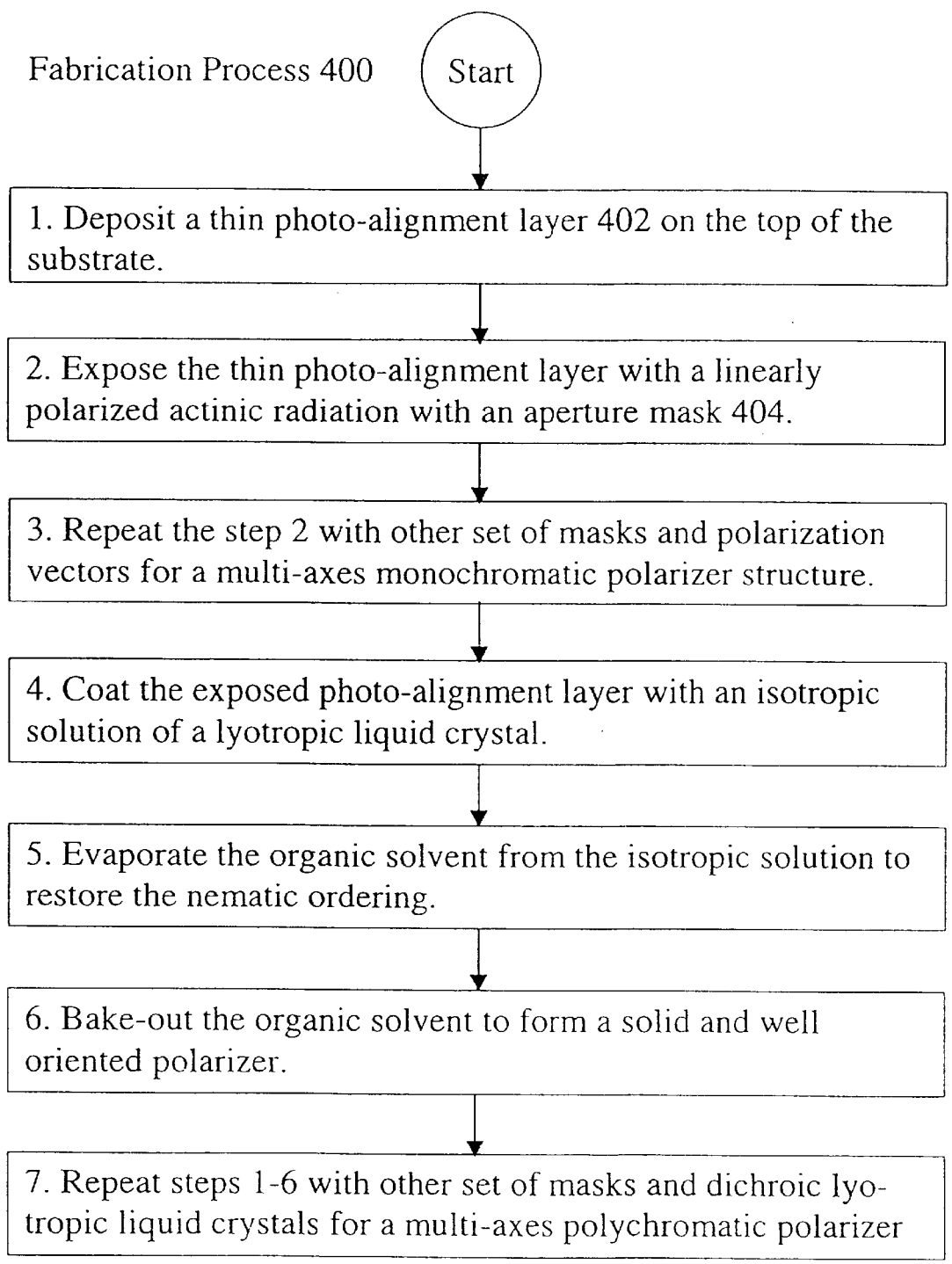
FIGS. 4a–b show (a) a high level flow chart showing the process for the fabrication of a photo-patterned (pixelated) polarizer in accordance with a second embodiment of the present invention.
Figure 4B:
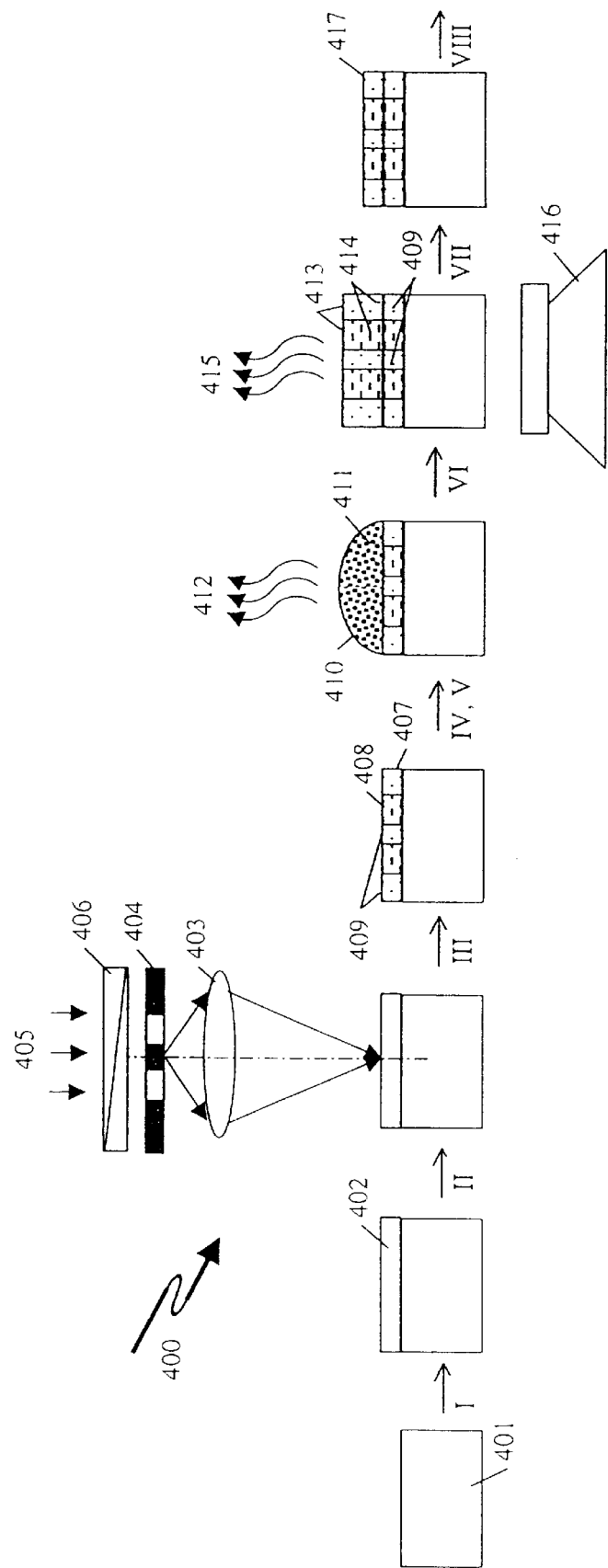

In FIGS. 4a–b, another method for the fabrication of photo-patterned (pixelated) polarizers in accordance with this invention is shown. The thin film polarizers are prepared by evaporation of the LLC isotropic solution onto a photo-alignment layer. In this procedure, an initially isotropic solid film exhibiting photo-induced optical anisotropy is used as an alignment layer. The photo-induced anisotropy and the absorption dichroism are formed in the alignment film as a result of the reversible (photochromic) or irreversible (photochemical) reactions. When the molecules absorb either polarized or non-polarized quanta of light, a molecular order is formed on the surface and in the bulk of such a photo-alignment layer. The degree of molecular order depends on the exposure energy, while the direction of the preferred molecular orientation is defined by the polarization vector and the plane of light incidence.

Due to the molecular dispersion forces between the photo-alignment film and the lyotropic liquid crystal, a homogeneous orientation of the whole lyotropic layer can be made possible. It has been discovered that certain organic photochemical stable substances, illuminated by a polarized or non-polarized light, show a much higher degree of induced molecular order than that found in an active photochemical molecular layer. The molecular order, which was evaluated by the photo-induced optical anisotropy, becomes saturated in the photo-chromic substances. This is contrary to the case where the molecular order is due to the irreversible photo-chemical reaction. In the latter case, the induced optical anisotropy decreases for sufficiently high exposure energy, i.e. the molecular order depends on the exposure energy critically.

In addition it is possible to induce the photo-alignment for a lyotropic liquid crystal, using obliquely incident non-polarized light. In this case, the molecular order in the photo-alignment layer increases with the exposure energy. The preferred orientation of the lyotropic molecules is parallel to the plane of oblique incidence and depends on the interaction between the lyotropic and dye molecules. Thus expensive UV-polarizers can be eliminated and the whole production process of thin internal polarization films can be considerably simplified.

Azodye AD-1 with the following structural formula is used:

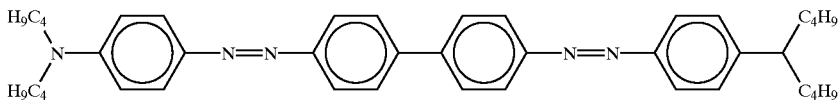

Figure 5:
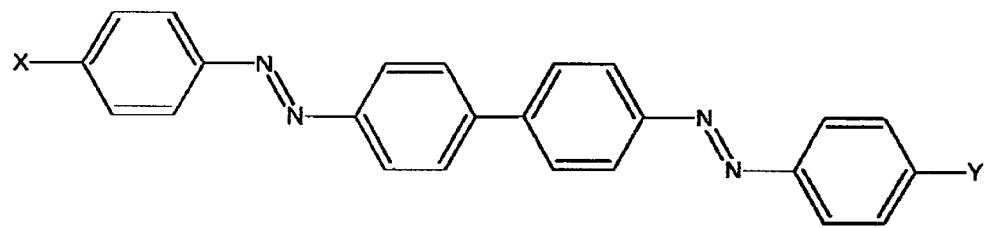
FIG. 5 shows structural formulae of the photochemical stable azodyes that may be used for the preparation of photo-alignment layers, FIG. 6 schematically illustrates the use of oblique exposure of a photo-alignment layer with a non-polarized light, FIG. 7 schemattically illustrates possible methods for the.formation of photo-patterned (pixelated) thin film polarizers using obliquely incident non-polarized light.
Figure 5:
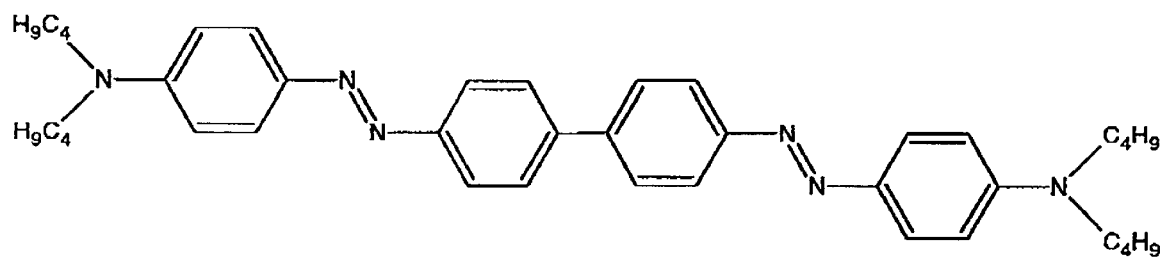
Figure 5:
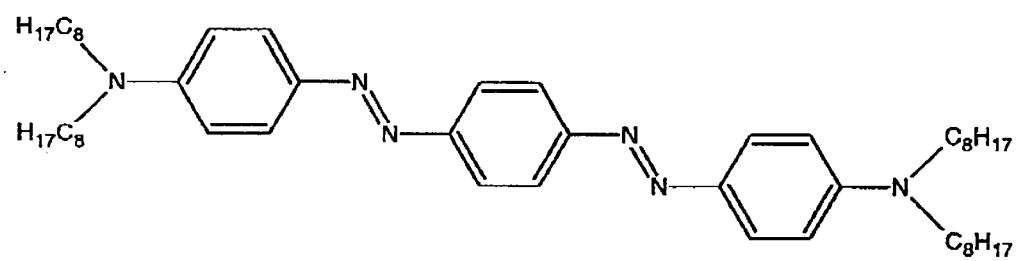

This azodye is a photo-chemically stable substance for the photo-alignment. The structural formulae of the other photo-chemically stable azodyes, which can be used for the preparation of photo-alignment layer are given in FIG. 5.

Figure 6:
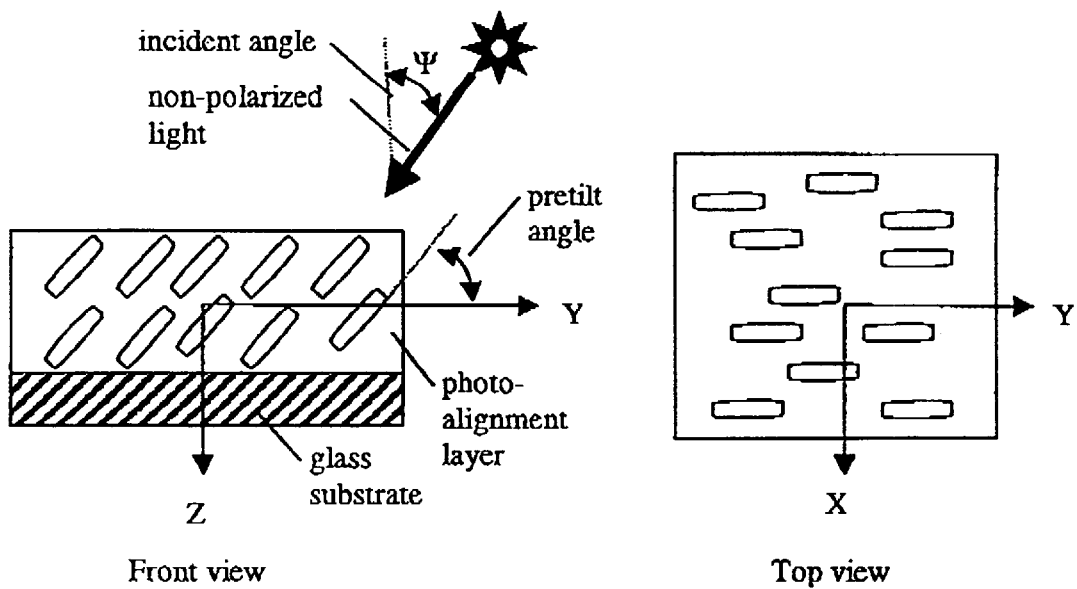
Figure 7:
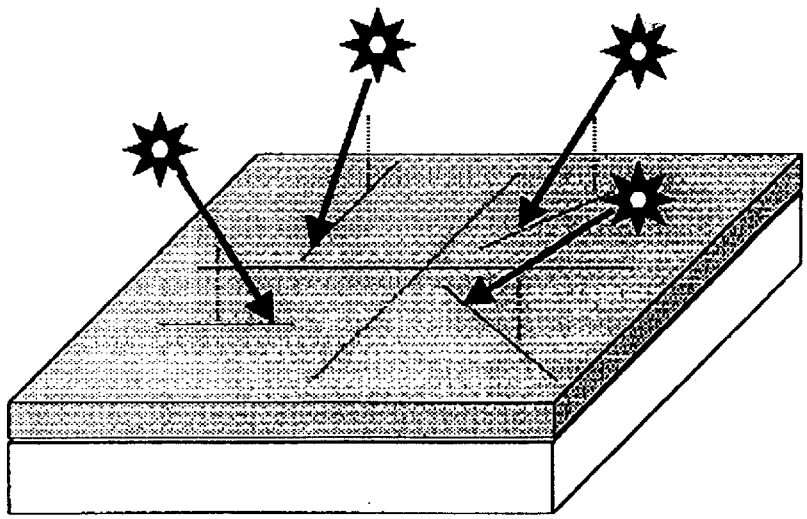

The fabrication process 400 in accordance with this embodiment of the present invention is shown in FIG. 4a. At the first step of the process 400 (FIG. 4b), a photo-alignment layer 402 with a thickness of 10–200 nm is deposited on the top of the glass or plastic substrate 401. An amorphous film of the photo-chemically stable azodye AD-1 may be used as the photo-alignment film 402. The film was produced by spin coating, but thermal sputtering in vacuum can be used. The film 402 can also be deposited by dipping the substrate 401 in the solution of the substance AD-1. After the formation of the solid film 402, it is illuminated by light source 405. The polarizer 406, aperture mask 404 and the lens 403 constitute a simple imaging system for the photo-pattern transfer. The operation II. should be repeated to obtain a locally distributed polarization axis on the photo-patterned (pixelated) polarizers. A different set of aperture masks and polarization vectors can be used for this purpose. The polarizer 406 can be eliminated, if the photo-alignment film is exposed by non-polarized light at an oblique incidence (FIGS. 6 & 7).

After the steps II and III have been completed (FIG. 4a), the local polarization axis 408 is formed in the illuminated regions of the thin film 407 (FIG. 4b), and the regions 409 where they are not illuminated show a random axis orientation. The isotropic solution 410 of the lyotropic liquid crystal 411 is then coated onto the top of the photo-alignment layer. The lyotropic nematic ordering is restored at a certain concentration of the solvent. The desired concentration is achieved after the partial evaporation of the solvent 412, giving rise to the formation of a viscous gel film 413. The local orientations of the lyotropic molecules 414 are influenced by the local molecular order 409 in the photo-alignment layer 407. The baking-out of the solvent 415 from the lyotropic film 413 is made using a heater 416. This results in the formation of a highly ordered film 417 of the lyotropic liquid crystal with a high extinction ratio.

Thus, the technology proposed allows the obtaining of a thin (0.3–0.5 $\mu$m) one-layer film, which can be used as a neutral or color photo-patterned (pixelated) internal polarizer for LCDs. The minimal element size can be of the order of a few microns. To make a polychromatic polarizer, the lyotropic layer 417 can be coated by a new photo-alignment layer, and the operations II–VII can be repeated with other compositions of lyotropic liquid crystals. The isolation layers can be placed between different lyotropic polarization films if necessary (not shown in FIG. 4b). The total thickness of the final sandwiched photo-patterned (pixelated) polarizer can reach several microns.

Figure 8:
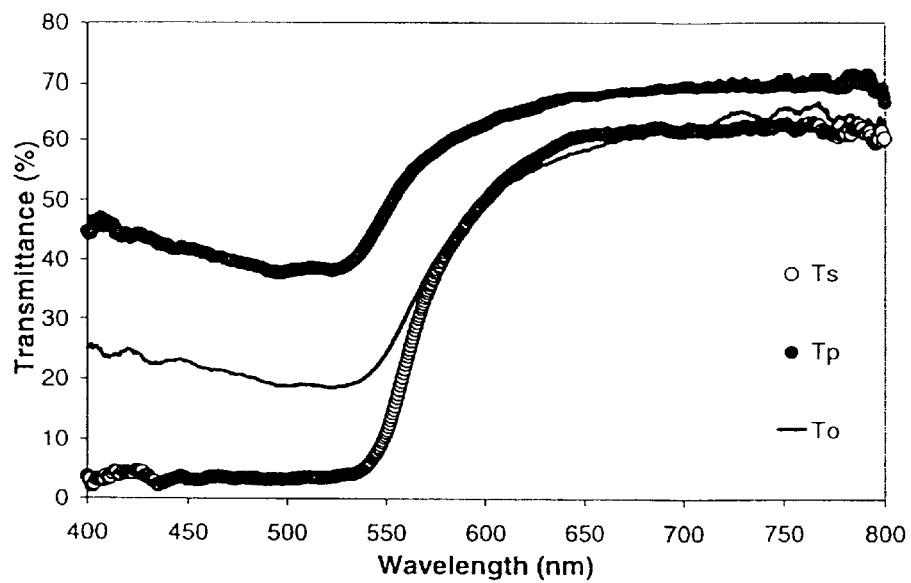
FIG. 8 shows transmission spectra of the azodye AD-1 before and after the exposure by a polarized light ($T_p$ and $T_s$ represent respectively the transmission spectrum perpendicular and parallel to the dye absorption axis, whereas $T_0$ is the transmission spectrum before UV irradiation)
Figure 9:
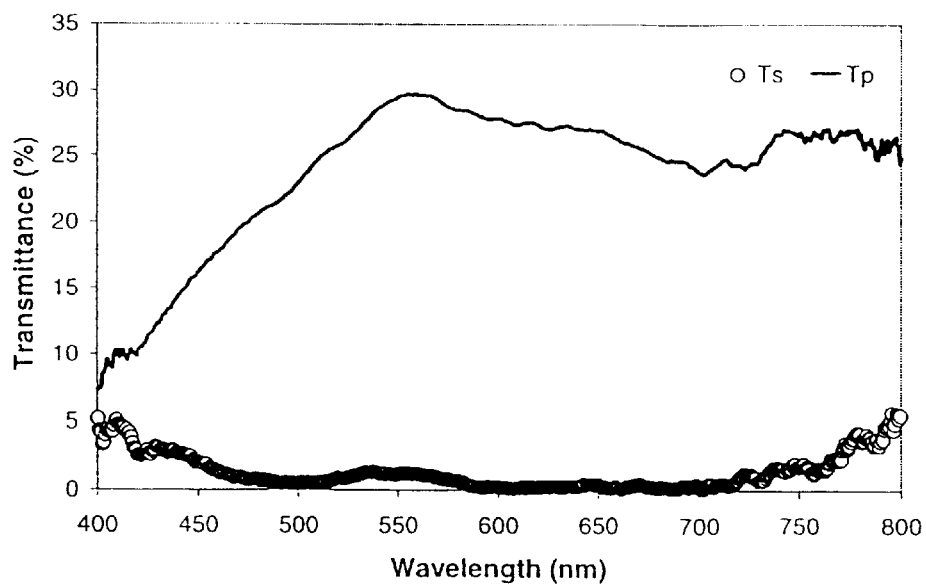
FIG. 9 shows polarized transmission spectra of a thin lyotropic polarizer ($T_p$ and $T_s$ represent respectively the transmission spectrum perpendicular and parallel to the azodye absorption axis), and FIG. 10 schematically illustrates a single large pixel covering the whole display area when all the local axes are aligned in a particular direction.
Figure 10:
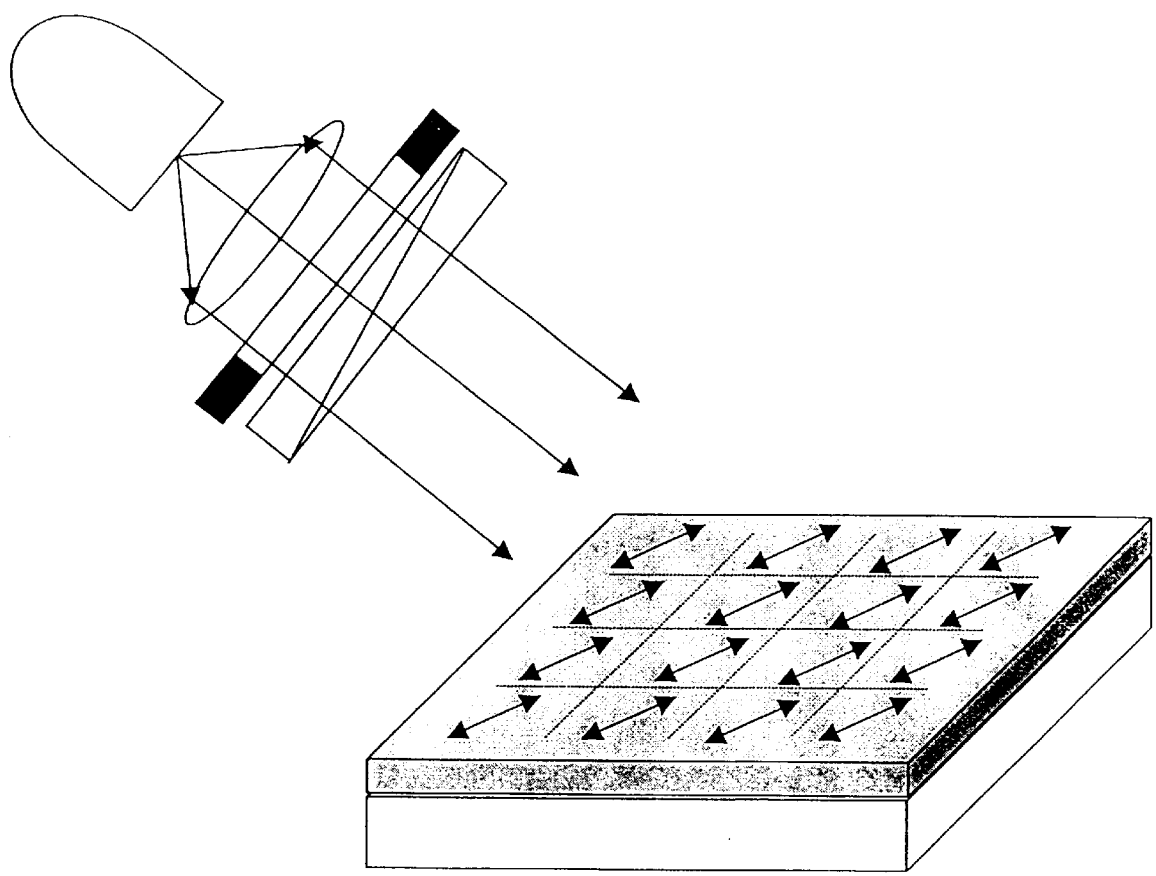

Dependent on the chemical structure of the lyotropic liquid crystals, the polarization axis can be oriented either parallel or perpendicular to the molecular axis of the photo-alignment layer. For instance, the preferred orientation of the lyotropic liquid crystals (Crystal Ink™) from OPTIVA Inc. is perpendicular to that of the AD-1 dye molecules in the photo-alignment layer. This allows a thin photo-patterned (pixelated) polarizer to be obtained using the azodye AD-1 and the lyotropic liquid crystals (Crystal Ink™) from OPTIVA Inc. The thickness of the polarizer was about 0.3–1.5 $\mu$m. The AD-1 layer was illuminated by a polarized light near the wavelength of the maximum absorption. The initially colored layer became transparent along the polarization direction of the illumination and highly absorptive at the orthogonal direction (FIG. 8). At the same time the average optical density $D_{av}$:

$$D_{av}=(D_{\parallel}+2D_{\perp})$$

remained practically the same. The polarization transmission spectra on the glass substrate of the thin internal lyotropic polarizer, prepared from the azodye AD-1 and lyotropic liquid crystals (Crystal Ink™) from OPTIVA Inc are shown in FIG. 9. In both technological solutions proposed in this invention, the special case is illustrated in FIG. 10 when all the local axes degenerate into a single direction using a linearly polarized light.

What is claimed is:

1. A method of forming a thin light polarization film on a substrate, comprising the steps of:
    (a) depositing a thin solid film polarizer onto a flexible polymeric carrier sheet,
    (b) applying a photo-curable glue onto said substrate,
    (c) bringing said thin solid film polarizer into contact with said glue,
    (d) illuminating and curing said glue without heating said glue, and
    (e) removing said carrier sheet.

2. A method as claimed in claim 1 wherein said step of illuminating and curing said glue is carried out by illuminating said glue in a pattern whereby a pattern of cured glue is formed and whereby when said carrier sheet is removed said thin solid film polarizer only remains attached to said glue in said pattern.

3. A method as claimed in claim 2 wherein regions of glue that are not cured are removed by a solvent.

4. A method as claimed in claim 2 wherein said illumination is carried out through a patterned mask.

5. A method as claimed in claim 4 wherein said mask is a shadow mask or a photomask formed by photolithography.

6. A method as claimed in claim 1 wherein said light polarization film is formed on said substrate in a pattern formed by regions of at least two different directions of polarization.

7. A method as claimed in claim 6 wherein said method comprises the steps of:
    (a) depositing a first solid thin film polarizer on a first flexible carrier, said first polarizer having a first polarization direction,
    (b) applying a photo-curable glue to said substrate,
    (c) bringing said first solid thin film polarizer into contact with said glue, (d) illuminating said glue in a first pattern to form a pattern of cured glue having said first solid thin film polarizer adhered thereto, (e) removing said first flexible carrier leaving said first solid thin film polarizer adhered to said substrate by said glue in said first pattern, (f) depositing a second solid thin film polarizer on a second flexible carrier, said second polarizer having a second polarization direction, (g) applying a photo-curable glue to said substrate, (h) bringing said second solid thin film polarizer into contact with said glue, (i) illuminating said glue in a second pattern to form a pattern of cured glue having said second solid thin film polarizer adhered thereto, and (j) removing said second flexible carrier leaving said second solid thin film polarizer adhered to said substrate by said glue in said second pattern.

8. A method as claimed in claim 6 wherein said light polarization film is divided into pixels having different light polarization directions.

9. A method as claimed in claim 8 wherein said pixels are divided into sub-pixels.

10. A method as claimed in claim 9 wherein said sub-pixels within a pixel are formed with different absorption colors.

11. A method as claimed in claim 1 wherein said light polarization film is formed on said, substrate in a plurality of pixels.

12. A method as claimed in claim 11 wherein the pixels have at least two different directions of polarization.

13. A method as claimed in claim 11 wherein all the pixels have the same direction of polarization.

14. A method as claimed in claim 1 wherein said flexible carrier sheet is formed of an isotropic or non-isotropic polymeric material.

15. A method as claimed in claim 1 wherein said carrier sheet includes a detachment layer.

16. A method as claimed in claim 15 wherein said detachment layer also serves as a polarization alignment layer.

17. A method as claimed in claim 16 wherein said detachment layer comprises a film of material selected from the group consisting of paraffin wax, mineral oils, barium stearate, resins, and uniaxially aligned polyethyleneterephthalate.

18. A method as claimed in claim 17 wherein the detachment and alignment layer is rubbed mechanically to obtain a desired orientation.

19. A method as claimed in claim 1 wherein said thin light polarization film is formed on a substrate that constitutes an inner surface of a liquid crystal cell.

20. The method of claim 1, wherein said glue is cured by means of photo-polymerization.

21. The method of claim 20, wherein said glue is a dry photo-polymerizable glue.

* * * * *